US006720798B2

(12) United States Patent
Mulder et al.

(10) Patent No.: US 6,720,798 B2
(45) Date of Patent: Apr. 13, 2004

(54) CLASS AB DIGITAL TO ANALOG CONVERTER/LINE DRIVER

(75) Inventors: Jan Mulder, Houten (NL); Yee Ling Cheung, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 19 days.

(21) Appl. No.: 10/158,193

(22) Filed: May 31, 2002

(65) Prior Publication Data

US 2003/0038740 A1 Feb. 27, 2003

Related U.S. Application Data

(63) Continuation-in-part of application No. 10/153,709, filed on May 24, 2002.

(51) Int. Cl.[7] .................................................. H03K 5/22
(52) U.S. Cl. .......................... 327/65; 327/562; 330/263; 330/264
(58) Field of Search ....................... 327/63, 65, 108–112, 327/560–563; 330/256, 253, 263, 264

(56) References Cited

U.S. PATENT DOCUMENTS

| | | | | |
|---|---|---|---|---|
| 3,846,712 A | * | 11/1974 | Kiko | 330/30 |
| 4,959,563 A | * | 9/1990 | Schenck | 326/32 |
| 5,006,727 A | * | 4/1991 | Ragosch et al. | 327/65 |
| 5,118,971 A | * | 6/1992 | Schenck | 326/32 |
| 5,554,943 A | * | 9/1996 | Moreland | 327/65 |
| 6,259,745 B1 | | 7/2001 | Chan | 375/285 |

OTHER PUBLICATIONS

Miyazaki et al.,"A 16mW 30MSamples/s 10b Pipelined A/D Converter using a Pseudo–Differential Architecture", *ISSCC 2002/Session 10/High–Speed ADCs/10.5*, Feb. 5, 2002, 3 pgs.

Sushihara et al., "A 7b 450MSample/s 50mW CMOS ADC in 0.3mm$^2$", *ISSCC 2002/Session 10/High–Speed ADCs/ 10.3*, Feb. 5, 2002, 3 pgs.

Dingwall et al.,"An 8–MHz CMOS Subranging 8–Bit A/D Converter", *IEEE Journal of Solid–State Circuits*, vol. SC–20, No. 6, Dec. 1985, pp. 1138–1143.

Abo, A.M. and Gray, P.R., "A 1.5–V, 10–bit, 14.3–MS/s CMOS Pipelined Analog–to–Digital Converter," *IEEE Journal of Solid–State Circuits*, IEEE, vol. 34, No. 5, May 1999, pp. 599–606.

Brandt, B.P. and Lutsky, J., "A 75–mW, 10–b, 20–MSPS CMOS Subranging ADC with 9.5 Effective Bits at Nyquist," *IEEE Journal of Solid–State Circuits*, IEEE, vol. 34, No. 12, Dec. 1999, pp. 1788–1795.

(List continued on next page.)

*Primary Examiner*—Timothy P. Callahan
*Assistant Examiner*—An T. Luu
(74) *Attorney, Agent, or Firm*—Sterne, Kessler, Goldstein & Fox, P.L.L.C.

(57) ABSTRACT

A differential line driver includes first, second, third and fourth cascode transistors connected in parallel, wherein drains of the first and third transistors are connected to a negative output of the differential line driver, and wherein drains of the second and fourth transistors are connected to a positive output of the differential line driver. First, second, third and fourth switching transistors are connected in series with corresponding first, second, third and fourth cascode transistors and driven by a data signal. First and second compound transistors inputting a class AB operation signal at their gates, wherein the first compound transistor is connected to sources of the first and second switching transistors, and wherein the second compound transistor is connected to sources of the third and fourth switching transistors.

39 Claims, 12 Drawing Sheets

OTHER PUBLICATIONS

Bult, Klaas abd Buchwald, Aaron, "An Embedded 240–mW 10–b 50–MS/s CMOS ADC in 1–mm$^2$," *IEEE Journal of Solid–State Circuits*, IEEE, vol. 32, No. 12, Dec. 1997, pp. 1887–1895.

Cho, T.B. and Gray, P.R., "A 10 b, 20 Msample/s, 35mW Pipelined A/D Converter," *IEEE Journal of Solid–State Circuits*, IEEE, vol. 30, No. 3, Mar. 1995, pp. 166–172.

Choe, M–J. et al., "A 13–b 40–Msample/s CMOS Pipelined Folding ADC with Background Offset Trimming," *IEEE Journal of Solid–State Circuits*, IEEE, vol. 35, No. 12, Dec. 2000, pp. 1781–1790.

Choi, M. and Abidi, A., "A 6–b 1.3–Gsample/s A/D Converter in 0.35–µm CMOS," *IEEE Journal of Solid–State Circuits*, IEEE, vol. 36, No. 12, Dec. 2001, pp. 1847–1858.

Flynn, M. and Sheahan, B., "A 400–Msample/s, 6–b CMOS Folding and Interpolating ADC," *IEEE Journal of Solid–State Circuits*, IEEE, vol. 33, No. 12, Dec. 1998, pp. 1932–1938.

Geelen, G., "A 6b 1.1GSample/s CMOS A/D Converter," IEEE International Solid–State Circuits Conference, IEEE, 2001, pp. 128–129 and 438.

Hoogzaad, G. and Roovers, R., "A 65–mW, 10–bit, 40 Msample/s BiCMOS Nyquist ADC in 0.8 mm$^2$," *IEEE Journal of Solid–State Circuits*, IEEE, vol. 34, No. 12, Dec. 1999, pp. 1796–1802.

Hosotani, S. et al., "An 8–bit 20–MS/s CMOS A/D Converter with 50–mW Power Consumption," *IEEE Journal of Solid–State Circuits*, IEEE, vol. 25, No. 1, Feb. 1990, pp. 167–172.

Ingino, J.M. and Wooley, B.A., "A Continuously Calibrated 12–b, 10–MS/s, 3.3V A/D Converter," *IEEE Journal of Solid–State Circuits*, IEEE, vol. 33, No. 12, Dec. 1998, pp. 1920–1931.

Ito, M. et al., "A 10 bit 20 MS/s 3 V Supply CMOS A/D Converter," *IEEE Journal of Solid–State Circuits*, IEEE, vol. 29, No. 12, Dec. 1994, pp. 1531–1536.

Kattman, K. and Barrow, J., "A Technique for Reducing Differential Non–Linearity Errors in Flash A/D Converters," *IEEE International Solid–State Conference*, IEEE, 1991, pp. 170–171.

Kusumoto, K. et al., "A 10–b 20–MHz 30–mW Pipelined Interpolating CMOS ADC," *IEEE Journal of Solid–State Circuits*, IEEE, vol. 28, No. 12, Dec. 1993, pp. 1200–1206.

Lewis, S. et al., "A 10–b 20–Msample/s Analog–to–Digital Converter," *IEEE Journal of Solid–State Circuits*, IEEE, vol. 27, No. 3, Mar. 1992, pp. 351–358.

Mehr, I and Singer, L., "A 55–mW, 10–bit, 40–Msample/s Nyquist–Rate CMOS ADC," *IEEE Journal of Solid–State Circuits*, IEEE, vol. 35, No. 3, Mar. 2000, pp. 318–325.

Nagaraj, K. et al., "Efficient 6–Bit A/D Converter Using a 1–Bit Folding Front End," *IEEE Journal of Solid–State Circuits*, IEEE, vol. 34, No. 8, Aug. 1999, pp. 1056–1062.

Nagaraj, K. et al., "A Dual–Mode 700–Msample/s 6–bit 200–Msample/s 7–bit A/D Converter in a 0.25–µm Digital CMOS," *IEEE Journal of Solid–State Circuits*, IEEE, vol. 35, No. 12, Dec. 2000, pp. 1760–1768.

Nauta, B and Venes, A., "A 70–MS/s 110–mW 8–b CMOS Folding and Interpolating A/D Converter," *IEEE Journal of Solid–State Circuits*, IEEE, vol. 30, No. 12, Dec. 1995, pp. 1302–1308.

Pan, H. et al., "A 3.3V 12–b 50–MS/s A/D Converter in 0.6µm CMOS with over 80–db SFDR," *IEEE Journal of Solid–State Circuits*, IEEE, vol. 35, No. 12, Dec. 2000, pp. 1769–1780.

Song, W–C. et al., "A 10–b 20–Msample/s Low–Power CMOS ADC," *IEEE Journal of Solid–State Circuits*, IEEE, vol. 30, No. 5, May 1995, pp. 514–521.

Sumanen, L. et al., "A 10–bit 200–MS/s CMOS Parallel Pipeline A/D Converter," *IEEE Journal of Solid–State Circuits*, IEEE, vol. 36, No. 7, Jul. 2001, pp. 1048–1055.

Taft, R.C. and Tursi, M.R., "A 100–MS/s 8–b CMOS Subranging ADC with Sustained Parametric Performance from 3.8 V Down to 2.2 V," *IEEE Journal of Solid–State Circuits*, IEEE, vol. 36, No. 3, Mar. 2001, pp. 331–338.

van der Ploeg, H. and Remmers, R., "A 3.3–V, 10–b 25–Msample/s Two–Step ADC in 0.35–µm CMOS," *IEEE Journal of Solid–State Circuits*, IEEE, vol. 34, No. 12, Dec. 1999, pp. 1803–1811.

van der Ploeg, H. et al., "A 2.5–V 12–b 54–Msample/s 0.25–µm CMOS ADC in 1–m$^2$ With Mixed–Signal Chopping and Calibration," *IEEE Journal of Solid–State Circuits*, IEEE, vol. 36, No. 12, Dec. 2001, pp. 1859–1867.

Vorenkamp, P. and Roovers, R., "a 12–b, 60–Msample/s Cascaded Folding and Interpolating ADC," *IEEE Journal of Solid–State Circuits*, IEEE, vol. 32, No. 12, Dec. 1997, pp. 1876–1886.

Wang, Y–T. and Razavi, B., "An 8–bit 150–MHz CMOS A/D Converter," *IEEE Journal of Solid–State Circuits*, IEEE, vol. 35, No. 3, Mar. 2000, pp. 308–317.

Yotsuyanagi, M. et al., "A 2 V, 10 b, 20 Msample/s, Mixed–Mode Subranging CMOS A/D Converter," *IEEE Journal of Solid–State Circuits*, IEEE, vol. 30, No. 12, Dec. 1995, pp. 1533–1537.

Yu, P.C. and LEE, H–S., "A 2.5–V, 12–b, 5–Msample/s Pipelined CMOS ADC," *IEEE Journal of Solid–State Circuits*, IEEE, vol. 31, No. 12, Dec. 1996, pp. 1854–1861.

* cited by examiner

CLASS AB DIGITAL TO ANALOG CONVERTER/LINE DRIVER

CROSS-REFERENCE TO RELATED APPLICATIONS

This application is a Continuation-in-Part of application Ser. No. 10/153,709, Filed: May 24, 2002, Titled: Distributed Averaging Analog to Digital Converter Topology, Inventors: Mulder et al. and is related to application Ser. No. 10/158,772, Filed: May 31, 2002; Titled: Analog to Digital Converter with Interpolation of Reference Ladder, Inventors: Mulder et al.; application Ser. No. 10/158,595, Filed: May 31, 2002, Titled: High Speed Analog to Digital Converter, Inventor: Jan Mulder; and application Ser. No. 10/158,773, Filed:May 31, 2002, Inventor: Jan Mulder; Titled: Subranging Analog to Digital Converter with Multi-Phase Clock Timing, Inventors: van der GOES et al., all of which are incorporated by reference herein.

BACKGROUND OF THE INVENTION

1. Field of the Invention

The present invention relates to line drivers, and more particularly to high-speed, low-distortion line drivers.

2. Related Art

FIG. 1 shows a conventional output driver cell of a line driver currently employed in (Gigabit) Ethernet products. Each cell includes two differential pairs, enabling tri-state operation. Transistors M1$a$ through M1$d$ are cascodes, implemented using thick-oxide transistors. Transistors M3$a$ and M3$b$ implement the tail current sources of the two differential pairs, each providing a current $I_{BIAS}$. Transistors M2$a$ through M2$d$ are switches (typically thin-oxide transistors) that control to which output terminal the bias current $I_{BIAS}$ is sent. More specifically, when $V_{switch1}$ and $V_{switch3}$ are logical "1", and $V_{switch2}$ and $V_{switch4}$ are "0", the differential output current $I_{OUT}$ equals $-2I_{BIAS}$. When $V_{switch1}$ and $V_{switch3}$ are "0", and $V_{switch2}$ and $V_{switch4}$ are "1", $I_{OUT}$ equals 2 $I_{BIAS}$. When $V_{switch1}$ through $V_{switch4}$ are all "1", $I_{OUT}$ equals zero. (In other words, the digital signal, or data signal, activates the switching transistors M2$_a$–M2$_d$.) A more detailed description of a conventional line driver can be found in commonly assigned U.S. Pat. No. 6,259,745.

$V_{BIAS}$ is a DC bias voltage that biases the tail current transistors M3$a$, M3$b$ to an analog amplifier mode. The switches M2$a$–M2$d$ send current to either the "+" or the "−" terminal of the output cell, which is a tri-state operating cell. The cell outputs either $2I_{BIAS}$, 0, or $-2I_{BIAS}$. To output zero current, while operating the cell in class B mode, gates of switches M2$a$–M2$d$ are switched to ground, and no current appears at the output. Due to the charge injected at node ①, the potential at the gate of M3 changes, resulting in distortion. Thus, there is unwanted modulation of the DC bias on the gate of the tail current transistors M3$a$, M3$b$.

As noted above, when $I_{OUT}$ has to be zero, $V_{switch1}$ through $V_{switch4}$ switch to "0". Unfortunately, switching off all four switches M2$a$–M2$d$ results in significant distortion of the output signal $I_{OUT}$. The cause of the distortion is explained by FIG. 2, which shows half of a line driver output cell. The distortion occurs when all four switches M2$a$–M2$d$ are switched to "0". In that case, node ② goes to ground potential. Through the parasitic capacitance $C_p$, charge is injected onto node ①. In general, the bias voltage $V_{BIAS}$ is generated by a current-biased diode, which has a finite output impedance modeled by $R_{BIAS}$. Furthermore, the parasitic capacitance $C_{p,bias}$ associated with the bias voltage $V_{BIAS}$ source and transistor M3 is quite large. As a consequence, the charge injected onto node ① causes the voltage on node ① to drop. It settles back slowly due to the finite voltage source impedance and the large parasitic capacitance connected to node ①. This results in modulation of the tail currents of the differential pairs, and therefore, in modulation of the amplitude of $I_{OUT}$, in other words, unwanted distortion.

$I_{OUT}$ (in differential mode)=$I_{OUT+}$–$I_{OUT-}$. $I_{OUT}$ is the differential output signal current. Its magnitude depends on the symbol to be transmitted and varies from −40 mA to 40 mA (in 1000BT, 100TX mode), from −100 mA to 100 mA(in 10BT mode). In Class AB mode, $I_{COMMON\_MODE}$=($I_{OUT+}$–$I_{OUT-}$)/2 varies from 20 mA to 10 mA, depending on the symbol to be transmitted. Thus:

$$I_{COMMON\_MODE}=20 \text{ mA (in Class-A mode)}.$$

$I_{COMMON\_MODE}$ varies from 20 mA to 10 mA (in Class-AB mode), hence the maximum saving of current is 10 mA. When $I_{COMMON\_MODE}$ switches from 20 mA to 10 mA, a glitch is seen that eventually settles to constant value—i.e., producing unwanted distortion.

SUMMARY OF THE INVENTION

The present invention is directed to a line driver that substantially obviates one or more of the problems and disadvantages of the related art.

There is provided a differential line driver includes first, second, third and fourth cascode transistors connected in parallel, wherein drains of the first and third transistors are connected to a negative output of the differential line driver, and wherein drains of the second and fourth transistors are connected to a positive output of the differential line driver. First, second, third and fourth switching transistors are connected in series with corresponding the first, second, third and fourth cascode transistors and driven by a data signal. First and second compound transistors inputting a class AB operation signal at their gates, wherein the first compound transistor is connected to sources of the first and second switching transistors, and wherein the second compound transistor is connected to sources of the third and fourth switching transistors.

In another aspect of the present invention there is provided a differential line driver including first and second half-cells, the half-cells cross connected to positive and negative differential outputs, each half-cell including first and second cascode transistors connected in parallel. First and second switching transistors are connected in series with the first and second cascode transistors and driven by a data signal. A first compound transistor inputs a class AB operation signal at its gate and connected to sources of the first and second switching transistors.

In another aspect of the present invention there is provided a differential line driver includes first and second half-cells, the half-cells cross connected to positive and negative differential outputs, each half-cell including first and second cascode transistors are connected in parallel. First and second switching transistors are connected in series with the first and second cascode transistors and driven by a voltage. A tail current transistor inputs a bias voltage at its gate and connected to sources of the first and second switching transistors, wherein a sum of charge injection at the gate of the tail current transistor is substantially zero during switching.

In another aspect of the present invention there is provided a class AB line driver including first and second half-cells cross connected to positive and negative differential outputs, each half-cell including first and second cascode transistors connected in parallel. First and second switching transistors are connected in series with the first and second cascode transistors. A tail current transistor inputs a bias voltage at its gate and connected to sources of the first and second switching transistors, wherein the bias voltage spikes last less than a clock cycle during switching for Gigabit Ethernet operation.

In another aspect of the present invention there is provided a programmable line driver including a plurality of cells, each cell selectively controlled by class AB operation signal and each cell including first and second half-cells cross connected to outputs of opposite polarity, each half-cell including first and second parallel cascode transistors. First and second switching transistors are each connected in series with the first and second parallel cascode transistors. A compound transistor inputs a bias signal at its gate and connected to sources of the first and second switching transistors, the compound transistor switched to class AB operation by the class AB operation signal, wherein same polarity outputs of the cells are added.

In another aspect of the present invention there is provided a differential line driver including a plurality of cascode transistors connected in parallel and to corresponding polarity outputs of the differential line driver. A plurality of switching transistors are connected in series with corresponding cascode transistors. A plurality of compound transistors input a class AB operation signal at their gates and connected in series with corresponding switching transistors.

In another aspect of the present invention there is provided a differential line driver including first and second half-cells, the half-cells cross connected to positive and negative differential outputs, each half-cell including first and second cascode transistors connected in parallel. First and second switching transistors connected in series with the first and second cascode transistors. A variable effective channel length transistor inputting a signal that changes its effective channel length at its gate and connected to sources of the first and second switching transistors.

Additional features and advantages of the invention will be set forth in the description which follows, and in part will be apparent from the description, or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE INVENTION

Reference will now be made in detail to the preferred embodiments of the present invention, examples of which are illustrated in the accompanying drawings.

Low-power operation is very important for Gigabit Ethernet chips. The line driver is an important contributor to the overall power consumption. (The line driver, or transmitter, is frequently a digital-to-analog converter (DAC), but will be referred to as "line driver" herein.) Therefore, class AB or class B operation, instead of class A operation, are alternatives for decreasing the power consumption of the line driver.

Line drivers frequently have class B operating mode. Unfortunately, the distortion of operating in that mode is higher than desired. A new circuit technique for implementing a low-distortion class AB line-driver for (Gigabit) Ethernet applications, is described herein, allowing significant reduction in power consumption, while preserving sufficient line driver linearity. In order to reduce power consumption of the line driver, it is desirable to reduce the quiescent current (idle current) $I_{IDLE}$.

Class A operation typically biases drivers to a certain (fairly large) quiescent current $I_{IDLE}$, e.g., $I_{IDLE}$=40 mA. In class AB operation, the quiescent current $I_{IDLE}$ is much smaller, or about 20 mA. For class B operation, the output cell is only turned on for when it is driving something, otherwise it is turned off. The idle current $I_{IDLE}$ for class B operation is essentially zero. As noted above, $I_{COMMON\_MODE}$=10 mA in class AB mode. Hence the $I_{IDLE}$—the output current during idle mode in the best case scenario—is (10 mA+10 mA)=20 mA (10 mA from the positive terminal, 10 mA from the negative terminal). In class A operation, $I_{COMMON\_MODE}$=20 mA and $I_{IDLE}$=40 mA(20 mA from the positive terminal, 20 mA from the negative terminal)

Figure 1:
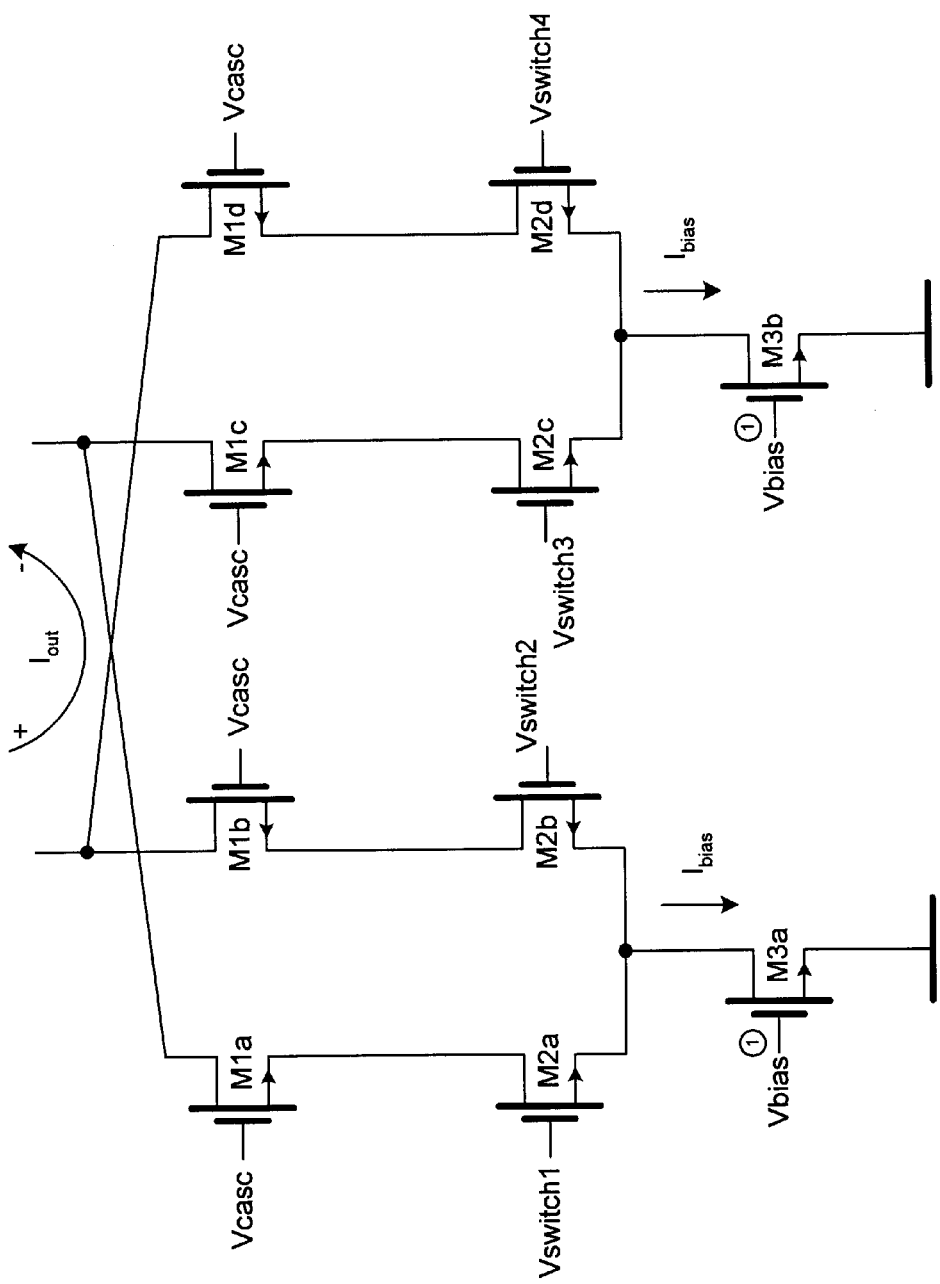
FIG. 1 illustrates a conventional line driver.
Figure 2:
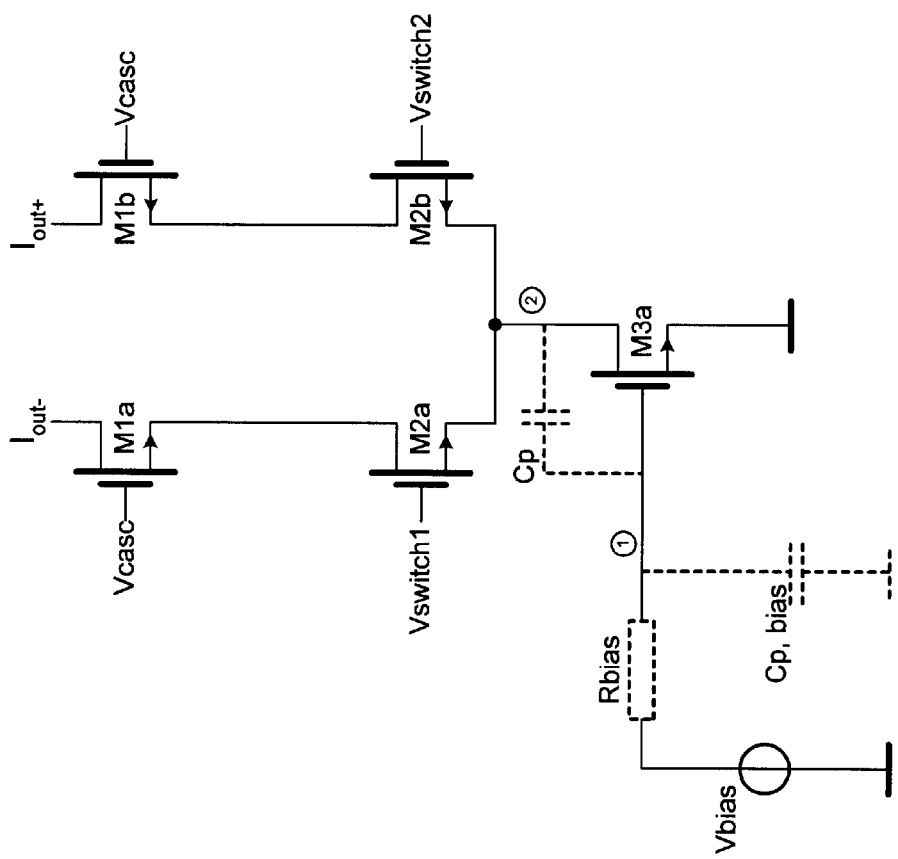
FIG. 2 illustrates a half cell of a conventional line driver.

The circuit of the invention prevents charge injection to node ① from occurring. To accomplish this, the simple tail current transistors M3a, M3b shown in FIG. 1 are replaced by "compound" transistors 301, 302, shown in FIG. 3. Transistors M5a and M5b are switches that control the effective channel length $L_{EFF}$ of the compound transistors 301, 302. When $V_{\overline{CLASSAB}}$ is "0", $L_{EFF}$ is determined by the channel length of the transistors M3, M4 and M6. When $V_{\overline{CLASSAB}}$ is "1", M5 effectively short circuits the transistor M4, and $L_{EFF}$ is determined mainly by the channel length of the transistors M3 and M6. Therefore, when $V_{\overline{CLASSAB}}$ switches from "1" to "0", $L_{EFF}$ increases, which causes the tail current source, and hence the power consumption, to decrease. The output cell switches to class B operation when $I_{OUT}$ needs to be zero, by switching $V_{switch1}$ through $V_{switch4}$ to "1" and $V_{\overline{CLASSAB}}$ to "0".

Figure 3:
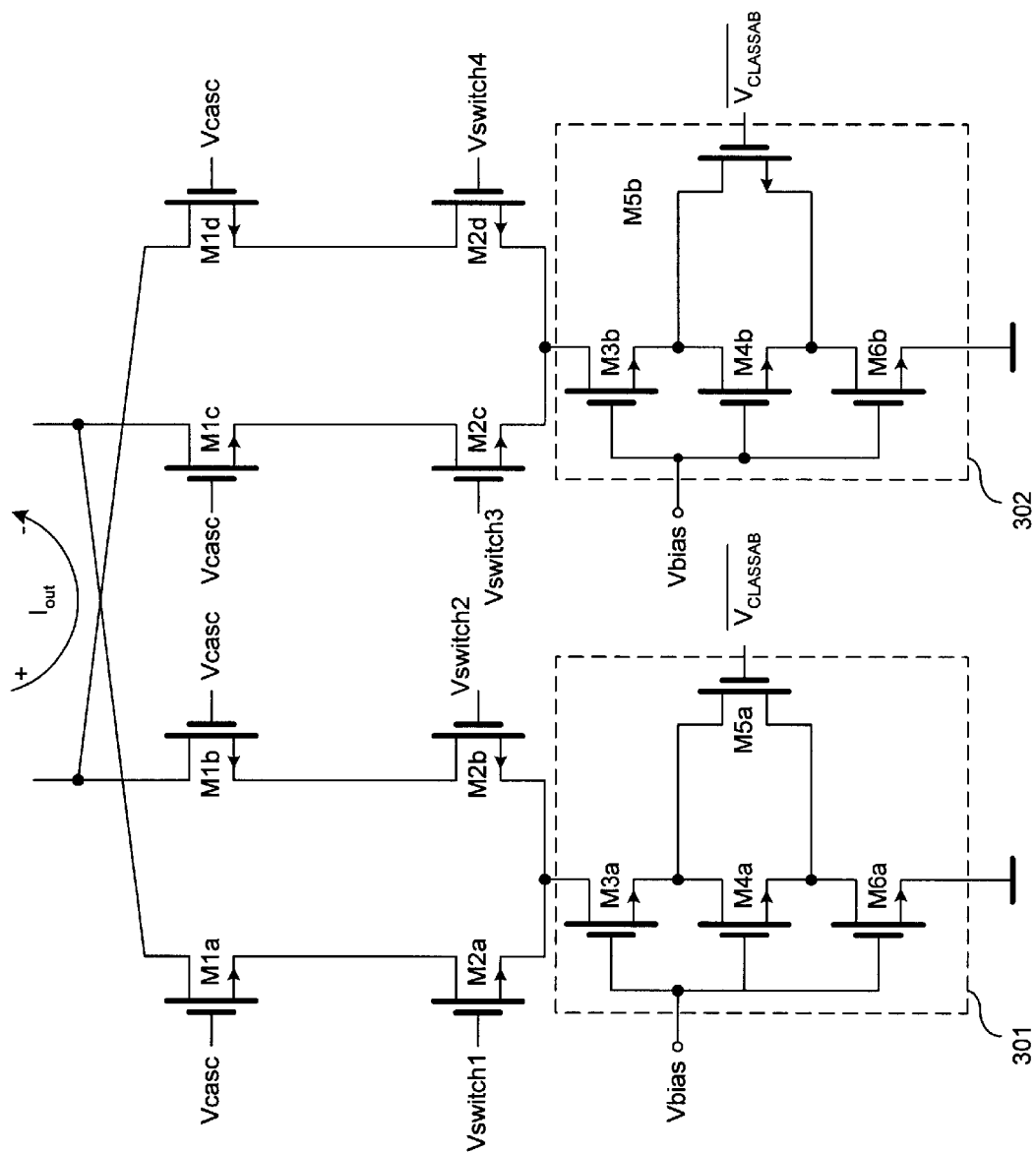
FIG. 3 illustrates a line driver of the present invention.

Further with reference to FIG. 3, FIG. 3 shows a differential output cell, comprising two half-cells, a left half-cell and a right half-cell. The output cell includes four cascode transistors M1a, M1b, M1c, and M1d, which are arranged in parallel. Drains of the cascode transistors M1a and M1c are connected to the negative polarity output, and drains of the cascode transistors M1b and M1d are connected to the positive polarity output of the differential cell. Gates of the cascode transistors M1a-M1d are driven by $V_{CASC}$. $V_{CASC}$ is a DC voltage of approximately 1 volt, and output voltage is about 1.8 V in the idle state. The transistors M1a through M1d are implemented using thick-oxide transistors. Note that the drains of the transistors M1a–M1d are connected to a primary coil of a transformer (not shown in the figures). A center tap of the transformer is connected to a 1.8 V supply The four cascode transistors M1a–M1d are connected in series with corresponding switch transistors M2a–M2d, sources of the cascode transistors M1a–M1d connected in series with drains of the switch transistors M2a–M2d. Gates of the switch transistors M2a–M2d are driven by corresponding inputs $V_{switch1}$ through $V_{switch4}$. The transistors M2a through M2d are switches (typically thin-oxide transistors, driven by about 1–1.2 volts) that control to which output terminal the bias current $I_{BIAS}$ is sent —i.e., a data signal drives the gates of the transistors M2a through M2d.

Sources of the switch transistors M2a, M2b are tied together and to a "drain" of the compound transistor 301. The compound transistor 301 includes three internal transistors M3a, M4a, M6a connected in series. Gates of the internal transistors M3a, M4a, and M6a are connected to a bias voltage $V_{BIAS}$. The source of the last transistor, M6a, is connected to ground. A fourth internal transistor M5a is connected across M4a. A gate of the internal transistor M5a is driven by the $V_{\overline{CLASSAB}}$ signal. When the $V_{\overline{CLASSAB}}$ signal goes to a logical one, the transistor M4a is shorted, and the effective channel length $L_{EFF}$ of the compound transistor 301 is reduced. The impedance of the transistor M5a is low when it is on.

The compound transistor 302 operates in a similar manner to compound transistor 301.

The table below shows the tri-state class AB operation of the circuit of FIG. 3:

| M2a | M2b | M2c | M2d | output | $V_{\overline{CLASSAB}}$ |
|---|---|---|---|---|---|
| 0 | 1 | 0 | 1 | $I_{OUT+}$ | 1 |
| 1 | 0 | 1 | 0 | $I_{OUT-}$ | 1 |
| 1 | 1 | 1 | 1 | $I_{OUT+}$, $I_{OUT-}$ | 0 |

Figure 4:
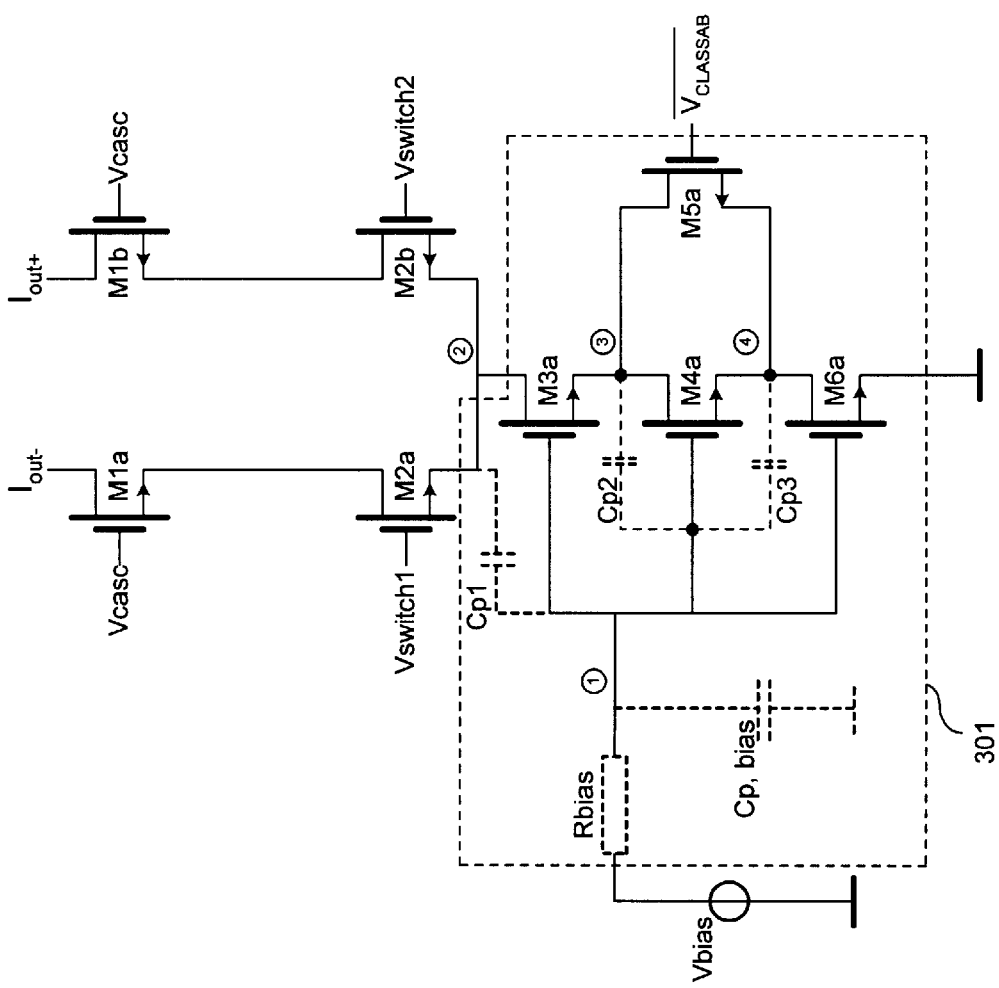
FIG. 4 illustrates a half cell of the line driver of the present invention.

FIG. 4 shows a half-cell of FIG. 3, with the parasitic capacitances shown as circuit elements. As shown on FIG. 4, node ① has $C_{P\_bias}$, connected to ground (a bias parasitic capacitance). Parasitic capacitance $C_{P1}$ is between node ① and node ②, parasitic capacitance $C_{P2}$ is between node ① and node ③, and parasitic capacitance $C_{P3}$ is between node ① and node ④.

The transistors M2a–M2d are used as switches, and the compound transistors 301, 302 are used as analog amplifiers. Typically, field effect transistors are used as the transistors illustrated in FIG. 3.

The aspect ratios W/L of individual transistors comprising the compound transistor 301 (or 302) are such that voltage at the node of $V_{BIAS}$ (node ① is not affected during switching, and idle current $I_{IDLE}$ is reduced by about fifty percent. Because there are no substantial interruptions, or spiking of the bias voltage $V_{BIAS}$, the output current is much cleaner, and shows less distortion. Note that since $V_{\overline{CLASSAB}}$ changes the aspect ratio of the compound transistors 301, 302, instead of changing $L_{EFF}$, it is equally possible to change effective channel width, or both Leff and the effective channel width.

Further with reference to FIG. 4, when the signal $V_{\overline{CLASSAB}}$ at the gate of M5a goes to zero, the potential at node ④ goes down, the potential at node ② goes up, and the potential at node ③ goes up. Thus, although more parasitics are involved, the net result of the charge injection is zero. $C_{P1}$, $C_{P2}$ and $C_{P3}$ of FIG. 4 deliver opposite polarity charges into node ①. Thus, although node ① has slow settling time, there is never any net charge injection, since the charge injection cancels out.

The compound transistor 301 behaves as if it is a single transistor, even though in actuality it includes at least four transistors. The aspect ratio of the compound transistor 301 depends on the state of the switch M5a, since the effective channel length $L_{EFF}$ varies depending on the input to M5a:

Aspect Ratio=W/$L_{EFF}$

By changing $L_{EFF}$, the effective aspect ratio W/L changes.

Thus, FIG. 4 explains why the new circuit implementation does not suffer from significant output current distortion. When the output cell switches to class-AB operation, the voltages on nodes ② and ③ will increase. Through parasitic capacitances $C_{p1}$ and $C_{p2}$ a positive charge injection onto node ① occurs. However, the voltage on node ① will decrease and through $C_{p3}$ a negative charge injection onto node ① occurs. If the dimensions of transistors M3, M4, M6 are carefully chosen, the positive and negative charge injections cancel each other, leaving the voltage on node ① undisturbed. This enables low-distortion class AB operation.

Figure 5:
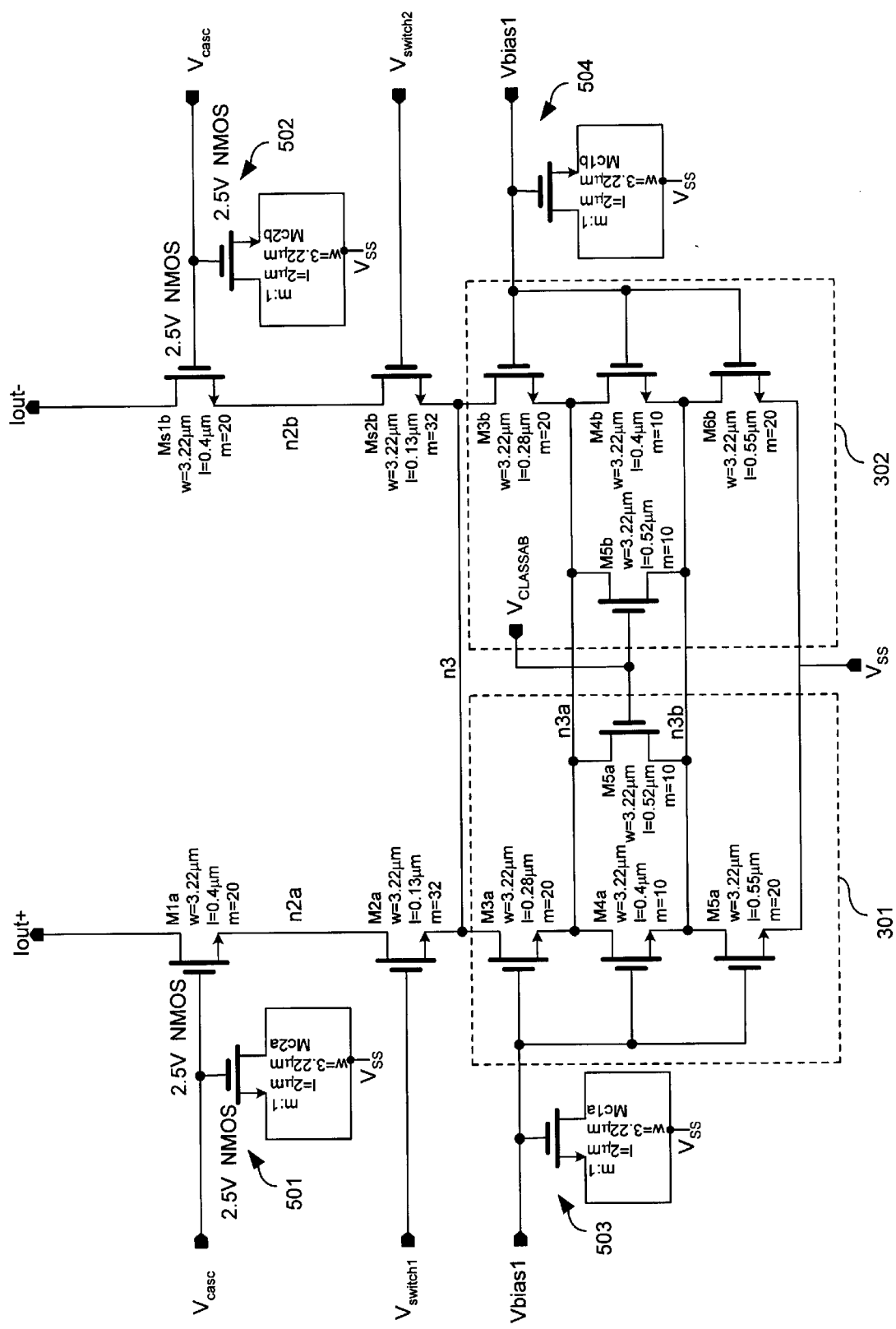
FIG. 5 illustrates additional detail of the circuit of FIG. 4

FIG. 5 shows additional detail of the structure of the half-cell, including dimensions of transistors used in one embodiment of the present invention. For example, the transistor M1a has a width of 3.22 μm, and a length of 0.4 μm. The multiplicity factor m=20 refers to the actual number of transistors M1a in each half-cell, i.e., in this case, 20. FIG. 5 also shows four NMOS transistors MC2a, MC2b, MC1a, MC1b, whose sources and drains are connected to $V_{SS}$, so that they function as capacitors. With the transistors of FIG. 5, the aspect ratio is about 160 when $V_{\overline{CLASSAB}}$ is HIGH, and about 80 when $V_{\overline{CLASSAB}}$ is LOW. In other words, for FIG. 5, when $V_{\overline{CLASSAB}}$ is HIGH, the aspect ratio=3.22 * 20 * 2/(0.28+0.52)=161.

Figure 6:
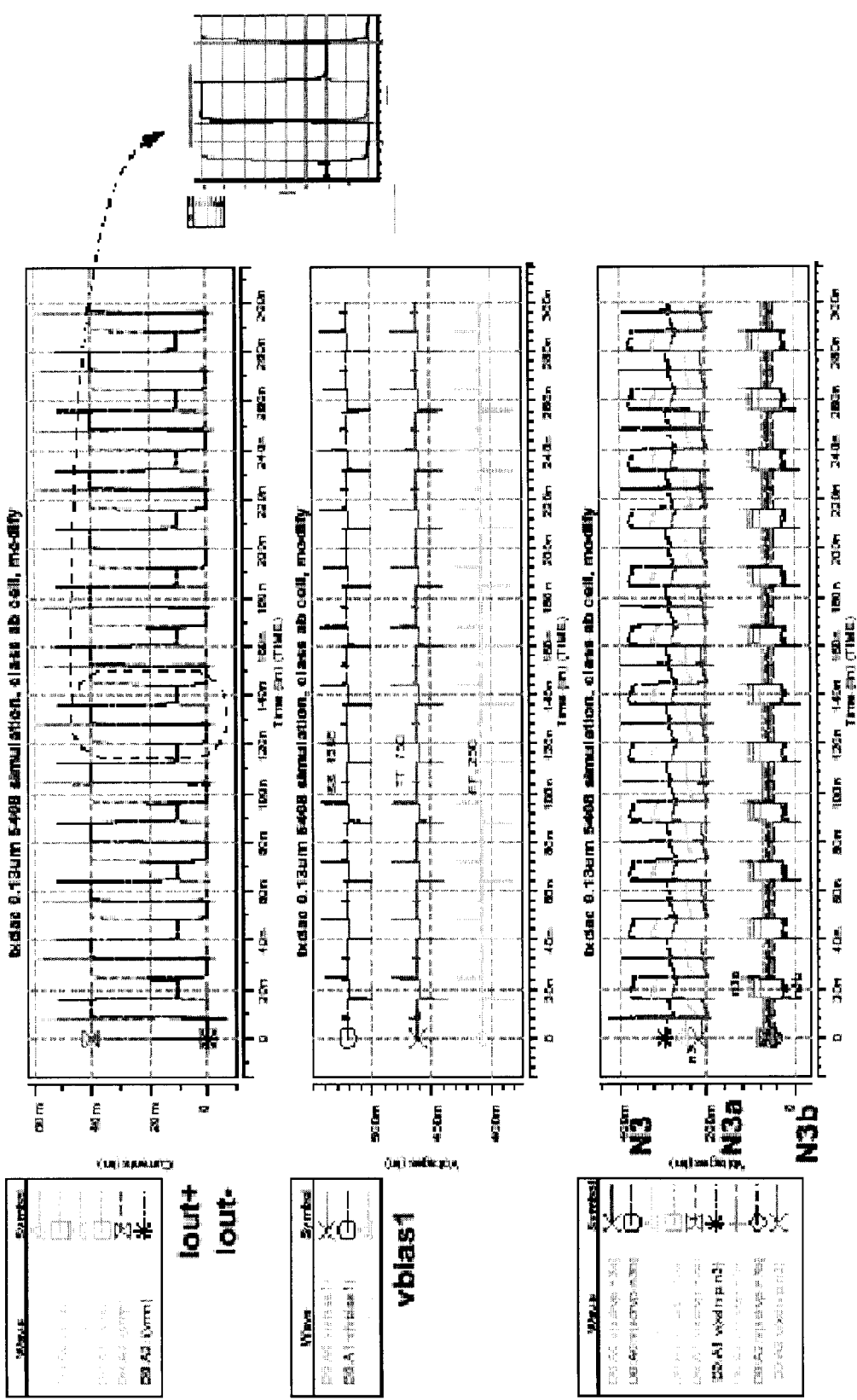
FIG. 6 illustrates current and voltage waveforms at various nodes of FIG. 5.
Figure 7:
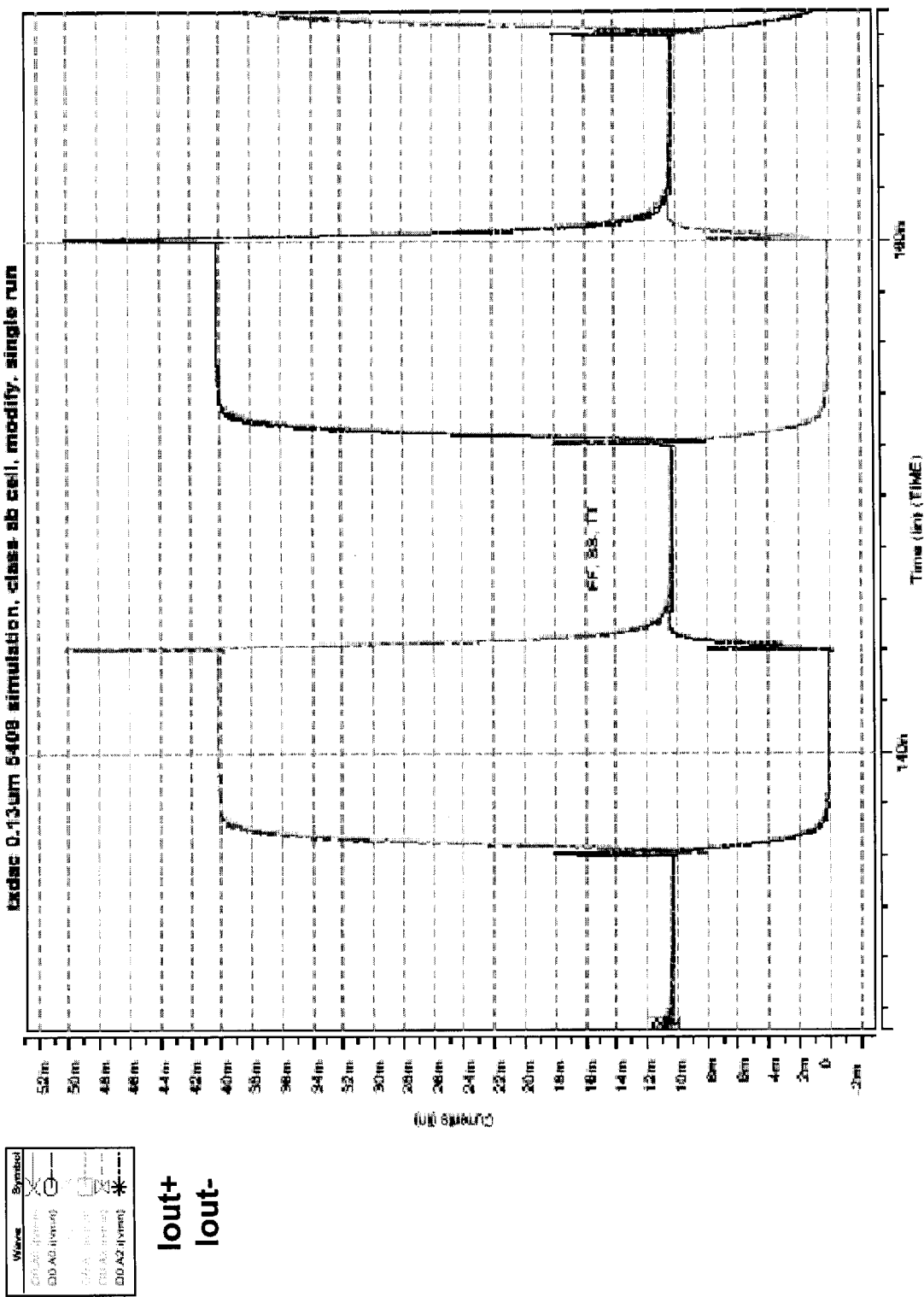
FIG. 7 illustrates an output current waveform.

FIGS. 6 and 7 illustrate a simulation of the output current $I_{OUT}$ of the present invention. As may be seen from FIGS. 6 and 7, the output current $I_{OUT}$ is very clean, showing only a small spike upon transition when operating in Gigabit Ethernet and 100TX mode.

Figure 8:
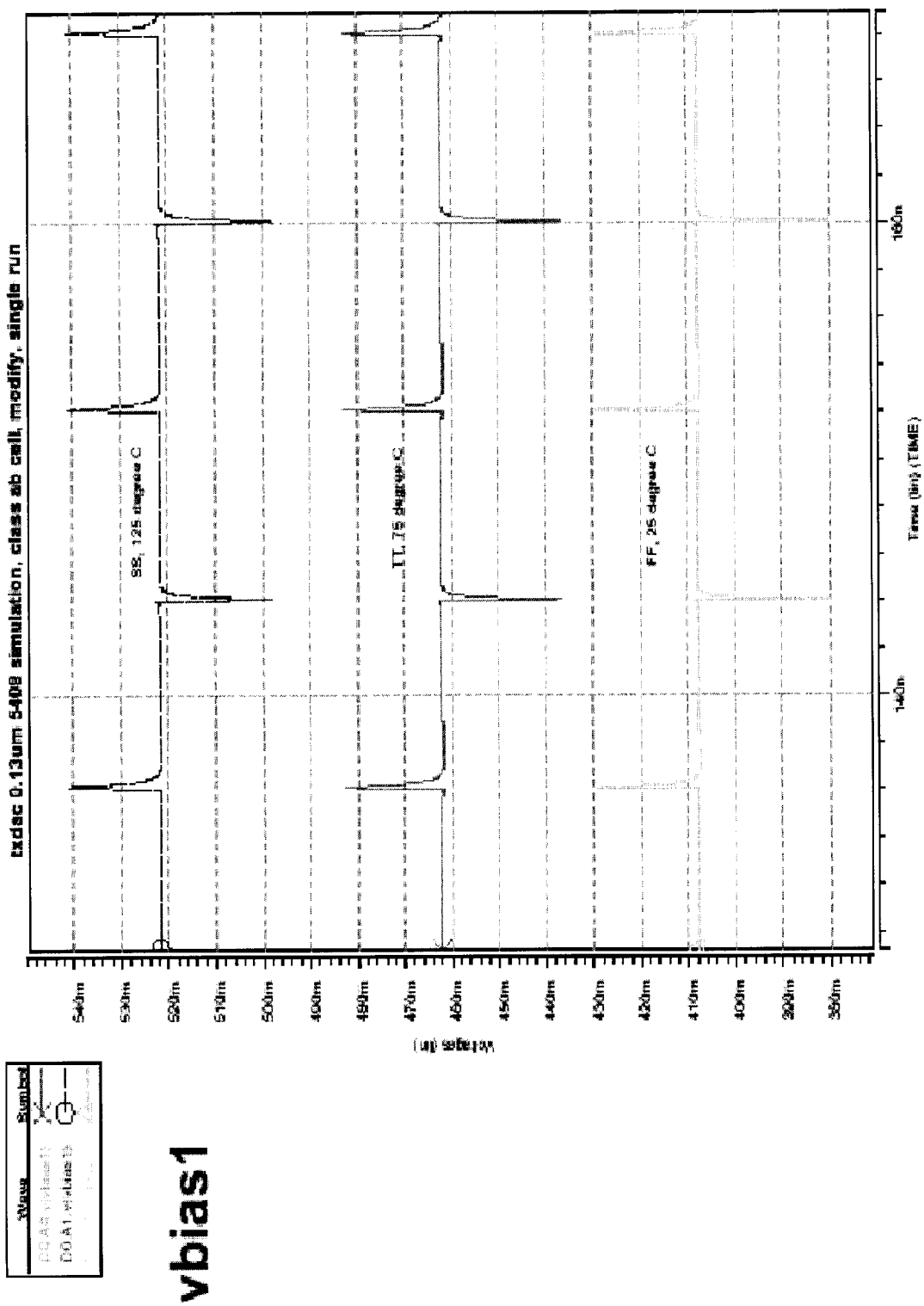
FIG. 8 illustrates a bias voltage waveform at node 1.

FIG. 8 shows the potential at node ① ($V_{BIAS1}$), and particularly illustrating the small spike of approximately 20–25 mV upon transition. The three curves shown in FIG. 8 represent operation at three different temperatures, 125° C., SS process for the top curve, 75° C., TT process for the middle curve, and 25° C., FF process for the bottom curve. Here:

SS—slow NMOS transistor, slow PMOS transistor.
TT—typical NMOS transistor, typical PMOS transistor.
FF—fast NMOS transistor, fast PMOS transistor.

As discussed above, such a small spike of 20–25 mV for a very short duration (i.e., substantially less than a clock cycle) results in a much cleaner output current, and very low distortion. Another way to look at it is to consider an area under the curve (i.e., spike energy) of each spike in FIG. 8, which is very low relative to overall pulse energy.

Figure 9:
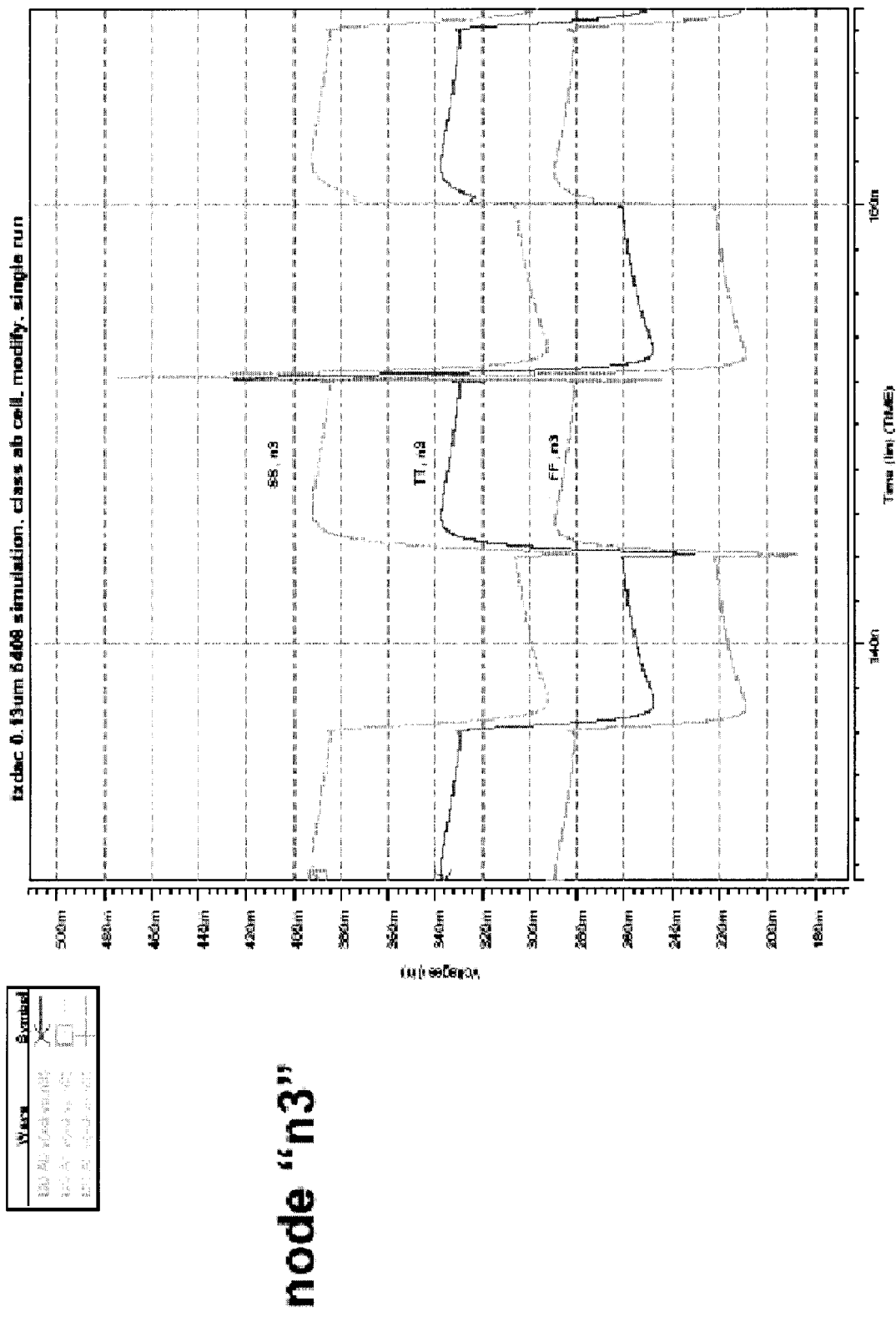
FIG. 9 illustrates a voltage waveform at node n3 of FIG. 5.
Figure 10:
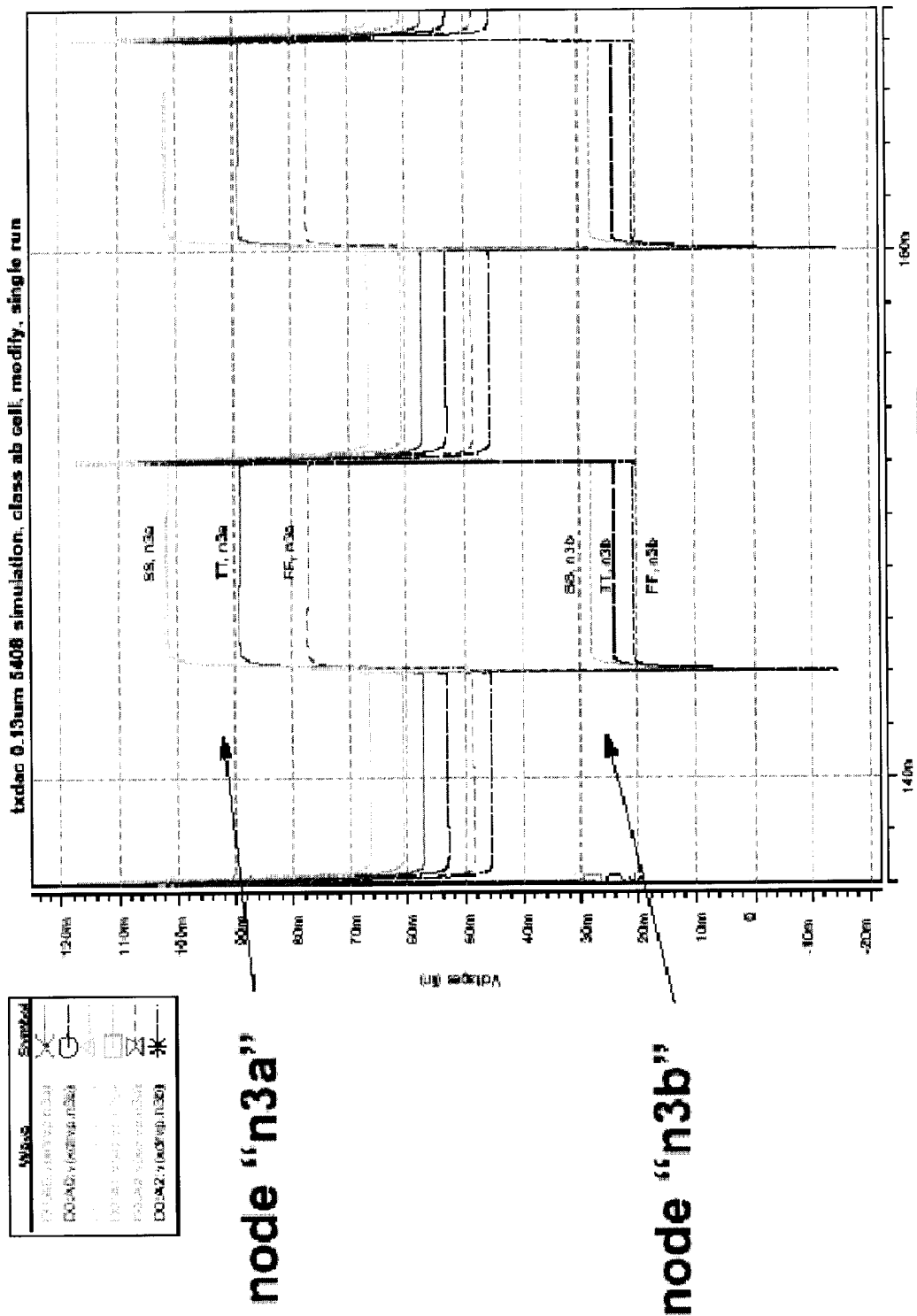
FIG. 10 illustrates a voltage waveform at nodes n3a and n3b of FIG. 5.

FIG. 9 shows the voltage at node n3 of FIG. 5 at three different temperatures and processes, 125° C. (SS process), 75° C. (TT process), and 25° C. (FF process). Similarly, FIG. 10 shows simulated voltages at nodes n3a and n3b of FIG. 5, at the three different temperatures discussed above. As may be seen from these figures, the voltage spikes on $V_{BIAS}$ due to charge injection are very small, enabling low distortion operation.

Figure 11:
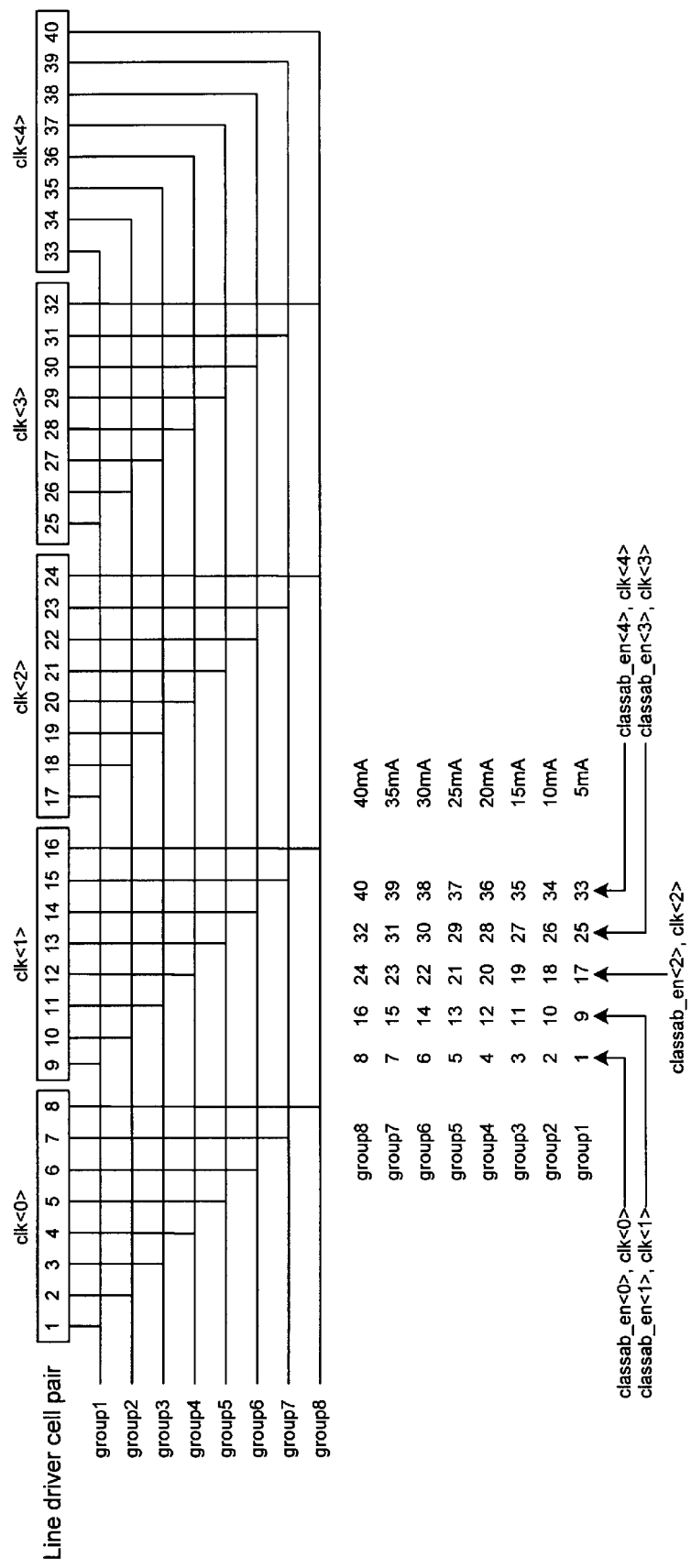
FIGS. 11 and 12 illustrate a multi-cell driver of the present invention.
Figure 12:
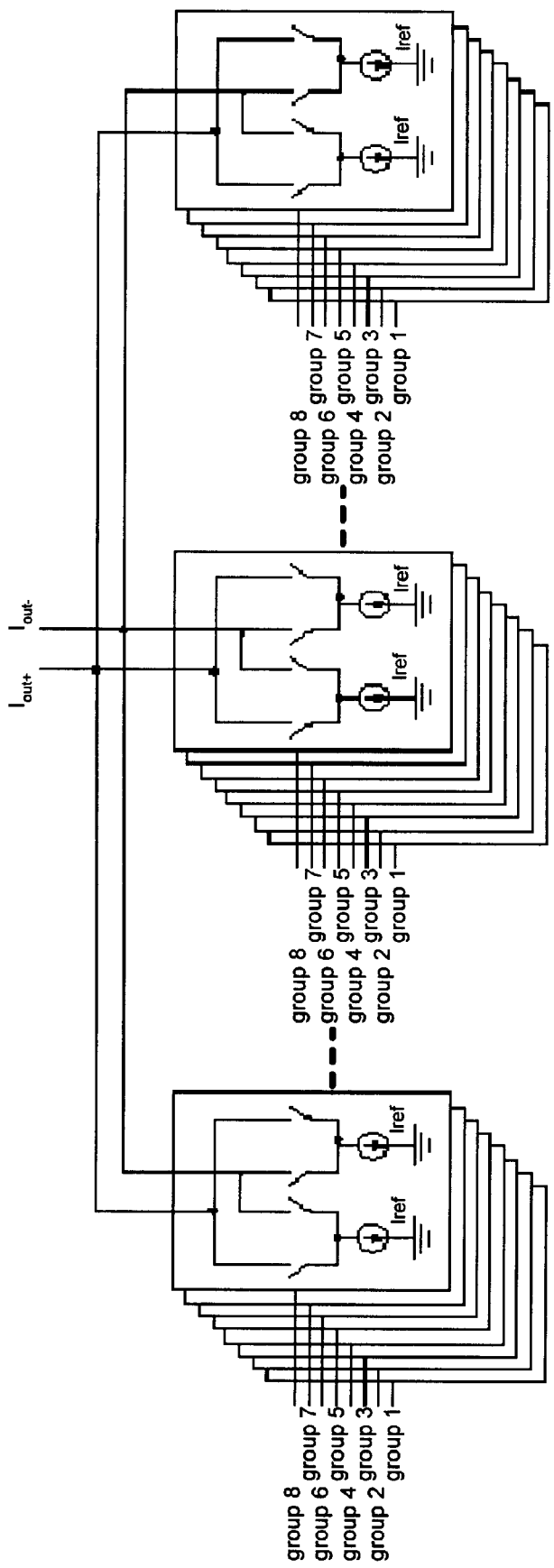

FIGS. 11 and 12 illustrates the entire line driver of the present invention that is comprised of a total of 40 output cells (24 cells are shown in FIG. 12) connected in parallel to each other, so that their output currents sum. Each "rectangle" in FIG. 12 corresponds to the circuit (cell) shown in FIG. 3. FIGS. 11 and 12 also illustrate that the output cells of the line driver can be grouped together so as to program their output current. For example, only the cells of Group 1 may be activated, resulting in an output current of 5 mA. When all the groups are activated by $V_{\overline{CLASSAB}}$ being on, the total output current is 40 mA (i.e., 8×5 mA current of the single group).

Note that the 40 pair differential line driver can operate at 40 mA maximum output current at 1000 Base T mode, or TX mode, with 2 $V_{PP}$ (peak to peak) output. It can also operate at 100 mA maximum output current in 10 Base T mode, 5 $V_{PP}$ output.

The quiescent current $I_{IDLE}$, when in class AB operation, can be controlled in several different ways. First, the dimensions (aspect ratios) of the individual transistors that comprise the compound transistor, determine the quiescent current obtained within each output cell. Secondly, more elaborate compound transistors are possible that allow programmability of the quiescent current of the DAC output cells. Thirdly, the switches M5 of all output cells comprising the complete line driver do not have to be controlled by only one signal $V_{\overline{CLASSAB}}$. Using different switch signals (e.g., $V_{\overline{CLASSAB1}} \ldots V_{\overline{CLASSAB8}}$) for different groups, or subsets, of output cells allows programmability of the overall quiescent current $I_{IDLE}$ of the entire line driver.

The class AB line driver of the present invention can, in principle, be used in any application where a digital to analog converter (DAC) is used as a line driver.

It will be appreciated that the various aspects of the invention as further disclosed in related application Ser. No. 10/153,709, Filed: May 24, 2002, Titled: Distributed Averaging Analog to Digital Converter Topology, Inventors: Mulder et al.; application Ser. No. 10/158,595, Filed: May 31, 2002; Titled: High Speed Analog to Digital Converter, Inventor: Jan Mulder; application Ser. No. 10/158,774, Filed: May 31, 2002, Titled: Analog to Digital Converter with Interpolation of Rererence Ladder, Inventors: Mulder et al.; and application Ser. No. 10/158,773, Filed: May 31, 2002, Inventor: Jan Mulder; Titled: Subranging Analog to Digutal Converter with Multi-Phase Clock Timing, Inventors: van der GOES et al., all of which are incorporated by reference herein, may be combined in various ways, or be integrated into a single integrated circuit or product.

It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. A differential line driver comprising:
    first, second, third and fourth cascode transistors driven by a first voltage, wherein drains of the first and third transistors are connected to a first output of the differential line driver, and wherein drains of the second and fourth transistors are connected to a second output of the differential line driver;

first, second, third and fourth switching transistors connected in series with corresponding first, second, third and fourth cascode transistors and driven by a corresponding data signal; and first and second compound transistors inputting a class AB operation signal to control output currents of the compound transistors, wherein the first compound transistor is connected to sources of the first and second switching transistors, wherein the second compound transistor is connected to sources of the third and fourth switching transistors, and wherein the first compound transistor includes first, second and third field effect transistors (FET's) connected in series with each other and with sources of the first and second switching transistors, and a fourth FET connected across the second FET, a gate of the fourth FET driven by the class AB operation signal.

2. The line driver of claim 1, wherein the first, second, third and fourth cascode transistors are field effect transistors.

3. The line driver of claim 1, wherein the second compound transistor includes fifth, sixth and seventh FET's connected in series with each other and with sources of the third and fourth switching transistors and an eighth FET connected across the sixth FET, a gate of the eighth FET driven by the class AB operation signal.

4. The line driver of claim 1, wherein effective channel length of the first compound transistor changes based on the class AB operation signal.

5. The line driver of claim 1, wherein the first, second, third and fourth switching transistors are field effect transistors.

6. The line driver of claim 1, wherein a source of the compound transistor is connected to ground.

7. A differential line driver comprising:
    first, second, third and fourth cascode transistors driven by a first voltage, wherein drains of the first and third transistors are connected to a first output of the differential line driver, and wherein drains of the second and fourth transistors are connected to a second output of the differential line driver;

first, second, third and fourth switching transistors connected in series with corresponding first, second, third and fourth cascode transistor and each driven by a corresponding data signal; and first and second compound transistors inputting a class AB operation signal to control output currents of the compound transistors, wherein the first compound transistor is connected to sources of the first and second switching transistors, wherein the second compound transistor is connected to sources of the third and fourth switching transistors, and wherein an effective channel length of the first and second compound transistors is variable.

8. A differential line driver comprising:
    first, second, third and fourth cascode transistors driven by a first voltage, wherein drains of the first and third transistors are connected to a first output of the differential line driver, and wherein drains of the second and fourth transistors are connected to a second output of the differential line driver;

first, second, third and fourth switching transistors connected in series with corresponding first, second, third and fourth cascode transistors and each driven by a corresponding data signal; and first and second compound transistors inputting a class AB operation signal to control output currents of the compound transistors, wherein the first compound transistor is connected to sources of the first and second switching transistors, wherein the second compound transistor is connected to sources of the third and fourth switching transistors, and wherein an effective channel width of the first and second compound transistors is variable.

9. A differential line driver comprising:

first, second, third and fourth cascode transistors driven by a first voltage, wherein drains of the first and third transistors are connected to a first output of the differential line driver, and wherein drains of the second and fourth transistors are connected to a second output of the differential line driver;

first, second, third and fourth switching transistors connected in series with corresponding first, second, third and fourth cascode transistors and each driven by a corresponding data signal; and first and second compound transistors inputting a class AB operation signal to control output currents of the compound transistors, wherein the first compound transistor is connected to sources of the first and second switching transistors, wherein the second compound transistor is connected to sources of the third and fourth switching transistors, and wherein total charge injected at a bias terminal of the first compound transistor is substantially zero.

10. A differential line diver comprising:

first and second half-cells, the half-cells cross connected to positive and negative differential outputs, each half-cells including:

first and second cascode transistors;

first and second switching transistors connected in series with the first and second cascode transistors an each driven by a corresponding data signal; and a compound transistor inputting a class AB operation signal to change its output current and connected to sources of the first and second switching transistors, wherein the compound transistor includes first, second and third FET's connected in series with each other and with sources of the first and second switching transistors, and a fourth FET connected across the second FET, a gate of the fourth FET driven by the class AB signal.

11. The line driver of claim 10, wherein an aspect ratio of the compound transistor changes based on the class AB operation signal.

12. The line driver of claim 10, wherein total change injected at a bias terminal of the first compound transistor is substantially zero.

13. The line driver of claim 10, wherein the first an second cascode transistor are field effect transistors.

14. The line driver of claim 10, wherein the first and second switching transistors are field effect transistors.

15. The line driver of claim 10, wherein a source of the compound transistor is connected to ground.

16. A differential line driver comprising:

first and second half-cells, the half-cells cross connected to positive and negative differential outputs, each half-cell including:

first and second cascode transistors;

first and second switching transistors connected in series with the first and second switching transistors, and each driven by a corresponding date signal; and a tail current transistor driven by a bias voltage and connected to sources of the first and second switching transistors, wherein total change injected at a gate of the tail current transistor is substantially zero during switching.

17. The line driver of claim 16, wherein the first and second cascode transistors are field effect transistors.

18. The line driver of claim 16, wherein effective channel length of the compound transistor changes based on a class AB operation signal driving the fourth FET.

19. The line driver of claim 16, wherein the tail current transistor includes a compound transistor.

20. The line driver of claim 19, wherein the compound transistor includes first, second and third FET's connected in series with each other and with sources of the first and second switching transistors, and a fourth FET connected across the second FET, a gate of the fourth FET driven by a class AB operation signal to control its output current.

21. The line driver of claim 19, wherein effective channel width of the compound transistor changes based on a class AB operation signal driving the fourth FET.

22. The line driver of claim 19, wherein effective channel length of the compound transistor is variable.

23. The line driver of claim 19, wherein effective channel width of the compound transistor is variable.

24. The line driver of claim 19, wherein the first and second switching transistors are field effect transistors.

25. A differential line driver comprising:

first and second half-cells, the half-cells cross connected to positive and negative differential outputs, each half-cell including:

first and second, cascode transistors first and second switching transistors connected in series with the first and second cascode transistors and each driven by a corresponding data signal; and a compound transistor inputting a class AB operation signal to change its output current and connected to sources of the first and second switching transistors, wherein an effective channel length of the compound transistor is variable.

26. A differential line driver comprising:

first and second half-cells, the half-cells cross connected to positive and negative differential outputs, each half-cell including:

first and second cascode transistors;

first and second switching transistors connected in series with the first and second cascode transistors and each driven by a corresponding data signal; and a compound transistor and inputting a class AB operation signal to change its output current and connected to sources of the first and second switching transistors, wherein an effective channel width of the compound transistor is variable.

27. A class AB line driver comprising:

first and second half-cells cross connected to positive and negative differential outputs, each half-cell including:

first and second cascode transistors;

first and second switching transistors connected in series with the first and second cascode transistors respectively; and a tail current transistor inputting a bias voltage at its gate and connected to sources of the first and second switching transistors, wherein the bias voltage spikes lasts less than a clock cycle of the data inputted to the class AB line during switching for Gigabit Ethernet operation and 100TX mode.

28. A programmable line driver comprising:

a plurality of cells, each cell's output current selectively controlled by a class AB operation signal and each cell including first and second half-cells cross connected to outputs of opposite polarity, each half-cell including:

first and second cascode transistors;

first and second switching transistors each connected in series with the first and second cascode transistors respectively; and a compound transistor inputting a bias signal at its gate and connected to sources of the first and second switching transistors, the compound transistor switched to class AB operation by the class AB operation signal, wherein same polarity outputs of the cells are added.

29. A line driver comprising:

first and second half-cells, the half-cells cross connected to positive and negative outputs, each half-cell including:

first and second cascode transistors connected in parallel;

first and second switching transistors connected in series with the respective first and second cascode transistors; and a variable effective channel length transistor inputting a signal that changes its effective channel length at its gate and connected between sources of the first and second switching transistors and ground.

30. A line driver comprising:

first and second half-cells, the half-cells cross connected to positive and negative outputs, each half-cell including:

first and second cascode transistors connected in parallel;

first and second switching transistors connected in series with the respective first and second cascode transistors; and a variable aspect ratio transistor inputting a signal that changes its effective channel length at its gate and connected between sources of the first and second switching transistors and ground.

31. A differential line driver comprising:

first and second half-cells, the half-cells cross connected to positive and negative differential outputs, each half-cell including:

first and second switching transistors each driven by a corresponding data signal; and a compound transistor inputting a class AB operation signal to change its output current and connected to sources of the first and second switching transistors, wherein one of effective channel width and effective channel length of the compound transistor changes based on the class AB operation signal.

32. A differential line driver comprising:

a plurality of switching transistors connected to corresponding polarity outputs of the differential line driver; and a plurality of tail current transistors with variable aspect ratios inputting a class AB operation signal at their gates to control their output current and connected in series with corresponding switching transistors, wherein the tail current transistor is switched to class AB operation by the class AB operation signal.

33. A line driver comprising:

first and second half-cells cross connected to outputs of opposite polarity, each half-cell including:

first and second transistors connected to the outputs and driven by a first voltage;

third and fourth transistors each connected in series with the first and second transistors respectively, and each driven by a corresponding data signal;

a first plurality of transistors connected in series with each other and driven by a second voltage, wherein a drain of a first transistor of the first plurality of transistors is connected to sources of the third and fourth transistors; and a second plurality of transistors each connected across a source and drain of one transistor of the first plurality of transistors and driven by a third voltage.

34. The line driver of claim 33, wherein a last transistor of the first plurality is connected to a supply voltage.

35. The line driver of claim 33, wherein all the transistors are field effect transistors.

36. The line driver of claim 33, wherein a number of transistors of the first plurality is at least greater than a number of transistors of the second plurality plus two.

37. The line driver of claim 33, wherein switching a transistor of the second plurality changes an effective channel length of a compound transistor formed by the first plurality of transistors.

38. The line driver of claim 33, wherein switching a transistor of the second plurality changes an effective channel width of a compound transistor formed by the first plurality of transistors.

39. The line driver of claim 33, wherein switching a transistor of the second plurality changes an aspect ratio of a compound transistor formed by the first plurality of transistors.

* * * * *

UNITED STATES PATENT AND TRADEMARK OFFICE
CERTIFICATE OF CORRECTION

PATENT NO. : 6,720,798 B2
DATED : April 13, 2004
INVENTOR(S) : Mulder et al.

It is certified that error appears in the above-identified patent and that said Letters Patent is hereby corrected as shown below:

Column 1,
Line 10, please replace "10/158,772" with -- 10/158,774 --.

Column 8,
Line 7, please replace "and driven" with -- and each driven --.
Line 33, please replace "wherein effective" with -- wherein an effective --.
Line 50, please replace "transistor" with -- transistors --.

Column 9,
Line 42, please replace "cells" with -- cell --.
Line 45, please replace "transistors an" with -- transistors and --.
Line 62, please replace "first an second" with -- first and second --.

Column 10,
Line 7, please replace "switching" with -- cascode --.
Line 8, please replace "date" with -- data --.
Line 38, please delete the comma after "second".
Line 55, please replace "transistor and inputting" with -- transistor inputting --.

Column 11,
Line 5, please replace "line during" with -- line driver during --.

Signed and Sealed this

Second Day of August, 2005

JON W. DUDAS
*Director of the United States Patent and Trademark Office*